(12) United States Patent
Gupta

(10) Patent No.: US 9,361,254 B2
(45) Date of Patent: Jun. 7, 2016

(54) MEMORY DEVICE FORMED WITH A SEMICONDUCTOR INTERPOSER

(71) Applicant: NVIDIA CORPORATION, Santa Clara, CA (US)

(72) Inventor: Alok Gupta, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 300 days.

(21) Appl. No.: 13/963,768

(22) Filed: Aug. 9, 2013

(65) Prior Publication Data

US 2015/0046612 A1 Feb. 12, 2015

(51) Int. Cl.
*G11C 5/02* (2006.01)
*G06F 13/40* (2006.01)
*G06F 13/42* (2006.01)

(52) U.S. Cl.
CPC ........ *G06F 13/4018* (2013.01); *G06F 13/4282* (2013.01); *Y02B 60/1228* (2013.01); *Y02B 60/1235* (2013.01)

(58) Field of Classification Search
CPC .......... H01L 2924/15311; H01L 2224/48145; H01L 25/0657; H01L 2225/06506; H01L 2225/0651; G11C 5/04; G11C 2213/71; G06F 12/04

USPC ........ 365/185.11, 51, 59, 63, 189.18, 189.05, 365/230.01, 230.05, 230.03, 233.13
See application file for complete search history.

(56) References Cited

U.S. PATENT DOCUMENTS

| | | | |
|---|---|---|---|
| 5,506,980 A * | 4/1996 | Inagami et al. | 711/159 |
| 8,873,320 B2 * | 10/2014 | Goel | G11C 29/76 365/149 |
| 2009/0083741 A1* | 3/2009 | Krishnan et al. | 718/102 |
| 2011/0246746 A1* | 10/2011 | Keeth et al. | 712/29 |
| 2012/0127675 A1* | 5/2012 | Hiraishi et al. | 361/748 |
| 2013/0238931 A1* | 9/2013 | Suzuki et al. | 714/15 |

* cited by examiner

*Primary Examiner* — Fernando Hidalgo
(74) *Attorney, Agent, or Firm* — Artegis Law Group, LLP

(57) ABSTRACT

A packaged memory device includes a semiconductor interposer, a first memory stack, a second memory stack, and a buffer chip that are all coupled to the semiconductor interposer. The first memory stack and the second memory stack each include multiple memory chips that are configured as a single stack. The buffer chip is electrically coupled to the first memory stack via a first data bus, electrically coupled to the second memory stack via a second data bus, and electrically coupled to a processor data bus that is configured for transmitting signals between the buffer chip and a processor chip. Such a memory device can have high data capacity and still operate at a high data transfer rate in an energy efficient manner.

23 Claims, 4 Drawing Sheets

MEMORY DEVICE FORMED WITH A SEMICONDUCTOR INTERPOSER

FIELD OF THE INVENTION

Embodiments of the present invention relate generally to computing systems and, more specifically, to a memory device formed with a semiconductor interposer.

DESCRIPTION OF THE RELATED ART

In many areas of modern computing, the use of high-capacity, high-bandwidth memory resources, such as dual in-line memory modules (DIMMs), is key for achieving targeted performance. This is particularly true for high-performance computing systems that process massive amounts of data very fast, such as servers, supercomputers, and high-end graphics processing systems. Furthermore, as more computing capability transitions to mobile platforms, energy efficiency is another important requirement for memory resources.

Generally, there is a trade-off in the capabilities of a memory device between data capacity, bandwidth (i.e., data transfer rate), and energy efficiency. To wit, the addition of multiple DIMMs to a memory bus greatly expands memory capacity of a computing system, but also significantly reduces bandwidth of the memory bus and therefore the rate at which data can be accessed. For example, data capacity of a computing system can be expanded from 32 GB to 128 GB by connecting four 8 GB double data rate fourth generation synchronous dynamic random-access memory (DDR4 SDRAM) DIMMs to each of four computing system memory buses. Because the operating frequency of the memory bus is reduced by the multiple loads thereon, e.g., from 1 GHz down to 666 MHz, data transfer rate to and from the four DDR4 SDRAM DIMMs is reduced significantly. Thus, memory capacity is increased at the expense of data transfer rate and hence overall available memory bandwidth.

Accordingly, there is a need in the art for a computing system memory that provides high capacity and high bandwidth in an energy efficient manner.

SUMMARY OF THE INVENTION

One embodiment of the present invention sets forth a packaged memory device that includes a semiconductor interposer, a first memory stack, a second memory stack, and a buffer chip that are all coupled to the semiconductor interposer. The first memory stack and the second memory stack each include multiple memory chips that are configured as a single stack. The buffer chip is electrically coupled to the first memory stack via a first data bus, electrically coupled to the second memory stack via a second data bus, and electrically coupled to a processor data bus that is configured for transmitting signals between the buffer chip and a processor chip.

One advantage of the above-described embodiment is that a memory device for a computing system can have high data capacity and still operate at a high data transfer rate in an energy efficient manner. Another advantage of the above-described embodiment is that a such a memory device can be configured with a significantly smaller form-factor than a dual in-line memory module, facilitating use in mobile devices or form-factor constrained designs such as a standard size add-on PCIe card.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
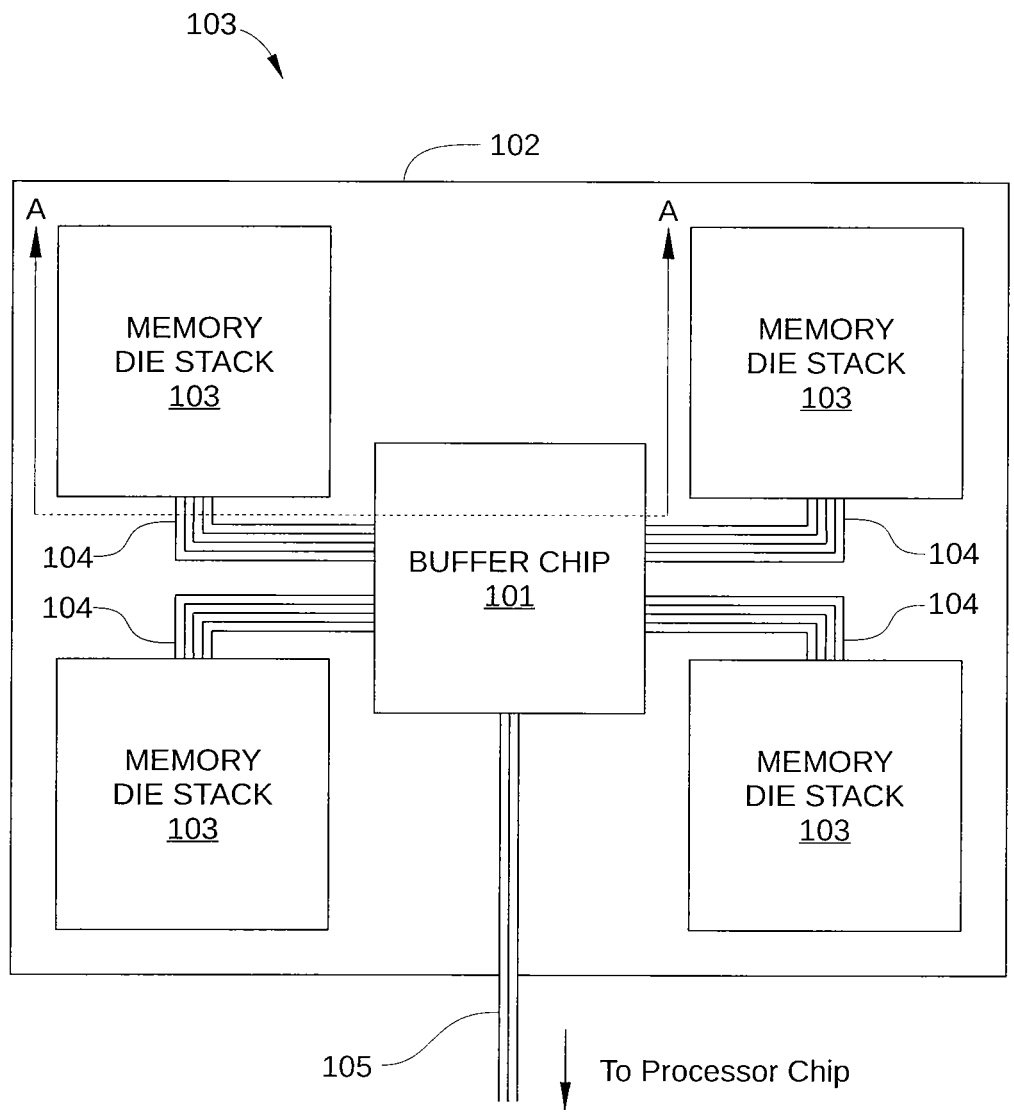
FIG. 1 is a schematic plan view of a memory device, according to one embodiment of the invention.

FIG. 1 is a schematic plan view of a memory device 100, according to one embodiment of the invention. Memory device 100 may be a memory module or other memory device for use in a computing system, such as a server, supercomputer, high-performance graphics processing system, and the like. As shown, memory device 100 may include a buffer chip 101 coupled to a semiconductor interposer 102 and multiple memory die stacks 103 coupled to semiconductor interposer 102. Buffer chip 101 is electrically coupled to each of memory die stacks 102 via data buses 104 and to a processor data bus 105, which is configured for transmitting signals between buffer chip 101 and a processor chip that is not a part of memory device 100.

Figure 2:
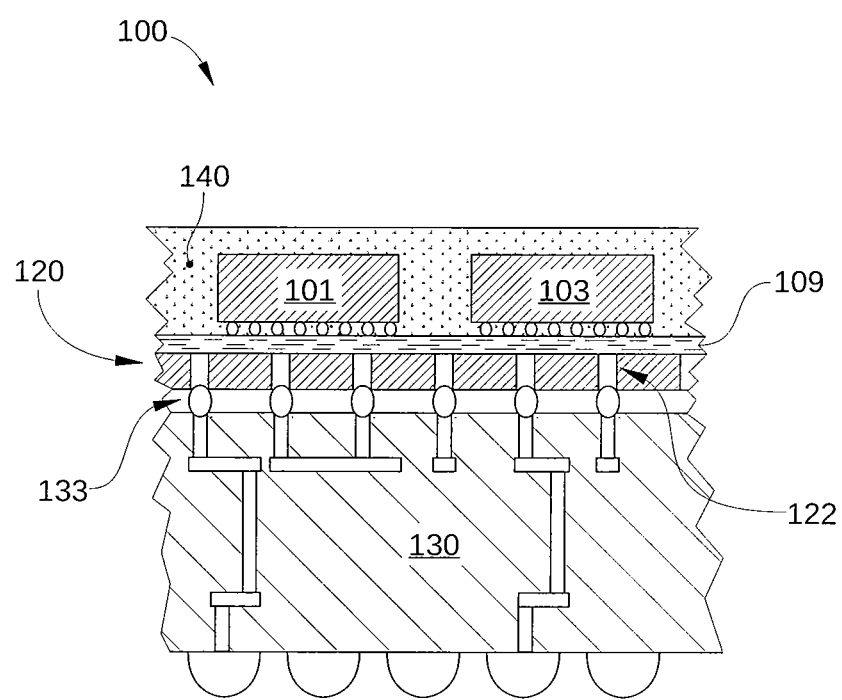
FIG. 2 is a partial cross-sectional view of the memory device in FIG. 1, taken at section A-A.

FIG. 2 is a partial cross-sectional view of the memory device in FIG. 1, taken at section A-A. As shown in FIG. 2, memory device 100 may also include an overmolding 140 that encapsulates and protects buffer chip 101 and memory die stacks 103 from mechanical damage, exposure to moisture, and other ambient contamination. In some embodiments, memory device 100 may also include a packaging substrate 130 on which semiconductor interposer 102 is mounted. Packaging substrate 130 may be a rigid and thermally insulating substrate on which interposer 120 is mounted and provides memory device 100 with structural rigidity. Packaging substrate 130 also provides an electrical interface for routing input and output signals and power between memory device 100 and a processor chip external to memory device 100.

Buffer chip 101 is electrically coupled to each of memory die stacks 102 via data buses 104 that are formed in one or more interconnect layers 109 of semiconductor interposer 102. Buffer chip 101 is also electrically coupled to a processor data bus 105, which is configured for transmitting signals between buffer chip 101 and a processor chip that is not a part of memory device 100. Typically, at least a portion of processor data bus 105 (shown in FIG. 1) is formed in the interconnect layer or layers 109 of semiconductor interposer 102.

Buffer chip 101 is configured to act as a controller for memory device 100 and to receive input/output (I/O), such as read and write commands, received from an external processor chip via processor data bus 105. Buffer chip 101 is further configured to convert such I/O signals received via processor data bus 105 to a communication protocol that is compatible for communication with memory die stacks 103. Specifically, buffer chip 101 converts I/O signals received via processor data bus 105 to a communication protocol that can be transmitted via a data bus that has a bit width greater than the bit width of processor data bus 105. For instance, in some embodiments, buffer chip 101 may communicate with the external processor chip via a graphics processing unit (GPU) memory interface protocol or a standard memory interface, such as a communication protocol that conforms to the graphics double data rate, version 5 (GDDR5) specification or to the double data rate, version 4 (DDR4) specification, or a high-speed serial interface, such as peripheral component interconnect express (PCI-E), a full-buffered DIMM interconnect (FBDIMM) or any full custom high-speed serial interface. In such embodiments, buffer chip 101 may communicate with one or more of memory die stacks 103 via a wide I/O communication protocol, or any other communication protocol that transmits data with a bit width that is greater than the bit width of processor data bus 105.

Generally, the GDDR5 specification is associated with buses having a bit width of 16 or 32 bits, whereas "wide I/O" is generally associated with buses having a bit width of 256 bits, 512 bits or more. Thus, processor data bus 105 is a narrow and fast bus, and I/O signals are transmitted to buffer chip 101 at a relatively high bus frequency, e.g., 1.6-10.0 GHz. In comparison to processor data bus 105, data buses 104 are wide and slow, and I/O signals are transmitted from buffer chip 101 to memory die stacks 102 at a relatively low bus frequency, e.g., 200-800 MHz. Because data buses 104 have significantly wider bit width than processor data bus 105, data received via processor data bus 105 can be transmitted to memory die stacks 103 in aggregate at a comparable data transfer rate (for example 16 gigabytes per second or more) even though transmitted at a lower bus frequency. For example, in an embodiment in which processor data bus 105 has 32 I/Os and buffer chip 101 receives data via processor data bus 105 at data transfer rate of 3.2 giga bits per second (Gpbs), buffer chip 101 receives data at a rate of 102.4 Gbps. Thus, memory device 100 has a memory bandwidth, i.e., an amount of data that can be transferred thereto or therefrom per second, of 102.4 Gbps upstream of buffer chip 101. To also have the same memory bandwidth downstream of buffer chip 101, buffer chip 101 can be configured to transmit 25.6 Gbps to each of memory die stacks 103. If each of data buses 104 has 128 I/Os, then buffer chip 101 only needs to transmit data to each of memory die stacks 103 at a bus frequency of 200 mega bits per second (Mbps).

In some embodiments, buffer chip 101 is configured to convert I/O signals received via processor data bus 105 to signals compatible with a wide I/O communication protocol, which has a bit width of 512 bits or more. In other embodiments, buffer chip 101 is configured to convert I/O signals received from the processor chip to signals compatible with an I/O communication protocol having a bit width that is greater than the bit width of processor data bus 105. In such embodiments, buffer chip 101 may convert the received I/O signals to I/O signals having a bit width that is a power of 2 times greater than the bit width of processor data bus 105, e.g., 2 times, 4 times, 8 times, 16 times, 32 times greater, etc.

In some embodiments, buffer chip 101 is configured to convert I/O signals received via processor data bus 105 that are compatible with a first communication protocol to signals that are compatible with a second communication protocol, where the first and second communication protocols are matched. In other words, the second communication protocol, by which buffer chip 101 transmits signals to memory die stacks 103, is substantially similar to the first communication protocol. Consequently, relatively limited conversion logic is used by buffer chip 101 for performing such a conversion, resulting in low energy expenditure by buffer chip 101. For example, in one embodiment, the first communication protocol may be a GDDR5 protocol, and the second communication protocol may be a wide I/O protocol, which is a dynamic random-access memory (DRAM) protocol that is substantially similar to GDDR5 protocol. Converting data at 25.6 Gbps from GDDR5 protocol to a wide I/O protocol with buffer chip 101 may use as little as 1 to 1.5 W. In contrast, converting data from a high-speed serial interface, such as PCI-E, at the same data transfer rate can use one or two orders of magnitude more power. Additionally, because data bus 104 can be configured with a wide I/O bus having, for example, 512 I/Os, data bus 104 can have a data transfer capacity of 25.6 gigabytes per second with a bus frequency of only 200 MHz DDR, which also reduces energy used compared to running data bus 104 at a 1.6 GHz or greater bus frequency.

Semiconductor interposer 102 may be an intermediate semiconductor layer or structure that provides electrical connections between buffer chip 101 and memory die stacks 103 and between buffer chip 101 and a processor chip external to memory device 100. Semiconductor interposer 102 may also provide electrical connections between memory device and any technically feasible mounting substrate. For example, the mounting substrate may be a packaging substrate included in memory device 100, such as packaging substrate 130, or a printed circuit board external to memory device 100. Semiconductor interposer 120 may be electrically coupled to mounting substrate 130 with through-silicon vias 122 (shown in FIG. 2) using any technically feasible electrical connection known in the art, including a ball-grid array (BGA) 133, a pin-grid array (PGA), and the like. In some embodiments, semiconductor interposer 120 is formed from a semiconductor substrate, such as a silicon wafer, thereby facilitating the formation of data buses 104, described below. In other embodiments, silicon interposer 102 may be formed from any suitable semiconductor material, including germanium, gallium arsenide, silicon carbide, silicon-germanium alloys, and the like.

Figure 3:
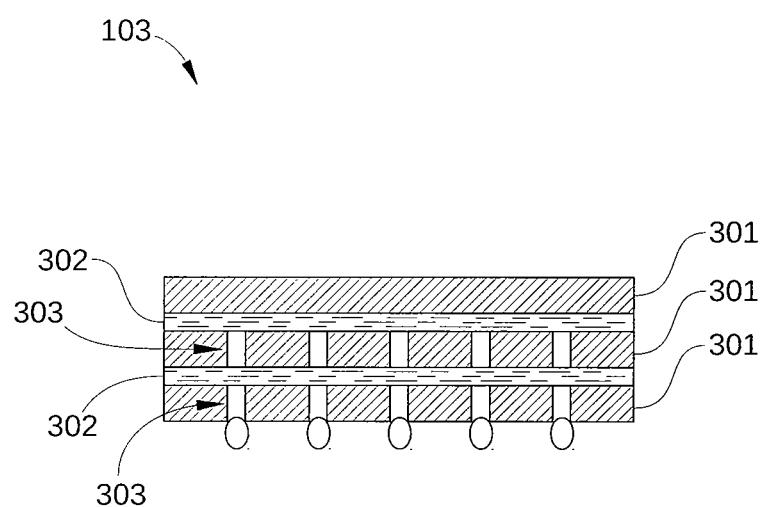
FIG. 3 is a schematic cross-sectional view of an embodiment of a memory die stack that may be included in the memory device of FIG. 1.

Each of memory die stacks 103 may include multiple memory chips that are configured as a single stack. In some embodiments, one or more of memory die stacks 103 are formed as a "3-D" memory package, in which two or more memory die are stacked, electrically and mechanically coupled to each, and packaged together to form a single memory array having a total of 2 GB, 8 GB, or more of memory. FIG. 3 is a schematic cross-sectional view of one embodiment of a memory die stack 103 that may be included in memory device 100. As shown, memory die stack 103 may include two or more memory dies 301 that are mechanically and electrically coupled to each other by interconnect layers 302. In the embodiment illustrated in FIG. 3, memory die stack 103 includes three memory dies 301, but in other embodiments, memory die stack 103 may include more or fewer memory dies 301, for example four, eight, or more. For example, memory die stack 103 may include eight 1 GB memory dies, or four 2 GB memory dies, for a total of 8 GB of memory in each memory die stack. Thus, in an embodiment of memory device 100 that includes four memory die stacks 103, memory device 100 includes 32 GB of memory in a very small form factor configuration compared to a conventional DIMM. In some embodiments, memory die stack 103 may further include overmolding (not shown) to encapsulate and protect memory dies 301 from mechanical damage, exposure to moisture, and other ambient contamination. The stacked module configuration of memory die stack 103 furnishes a space-efficient method of grouping and interconnecting the memory dies 301, and optimizes memory performance by facilitating a significant reduction in signal inductance. Specifically, by making the interconnection pathways to memory dies 301 shorter, data travels faster in a more power efficient manner and increases overall memory performance at a substantially better energy per transfer.

In some embodiments, memory dies 301 are electrically coupled to each other with through-silicon vias (TSVs) 303 formed in each of memory dies 301. TSVs 303 are conductive paths formed entirely through memory dies 301, and help enable 3D chip design. This is because signals can be transferred directly between memory dies 301 in memory die stack 103 without using exceedingly long interconnect traces or wire bonds, thereby avoiding latency and other signal integrity issues in memory die stack 103. In other embodiments, memory dies 301 do not include TSVs 303 and are joined electrically and mechanically to each other with peripherally located solder balls. Such ball contacts interconnect adjacent memory dies 301 and may protrude a short distance beyond the perimeter of memory dies 301.

Data buses 104 (shown in FIGS. 1 and 2) are formed in interconnect layer 109 on semiconductor interposer 120 and electrically couple memory die stacks 103 to buffer chip 101. Because semiconductor interposer 120 can be formed from a semiconductor substrate, data buses 104 can be formed thereon as conductive traces that are relatively small in comparison to data buses formed on packaging substrates using standard interconnect formation techniques. For example, data buses 104 can be configured as one-micron wide conductive traces formed in one or more interconnect layers 109 and can be separated by as little as one micron or less, so that a bus of 625 conductive traces can be formed with a width of one millimeter or less. In contrast, data buses formed on packaging substrates are generally on the order of 16 microns wide or wider, and are each separated by 16 or more microns. Consequently, the formation of data buses 104 on semiconductor interposer 120 allows 16 times the density of I/O traces as that of a data bus formed on a printed circuit board, as in a DIMM. Because such high I/O trace density can readily be formed on semiconductor interposer 120, data buses 104 may be configured to include a large number of I/O traces, e.g., 512, 1024, or more, on the relatively small surface area available on semiconductor interposer 120. Furthermore, the conductive traces of data buses 104 can be used to transmit I/O signals with significantly less power than that used to transmit I/O signals via the larger conductive traces formed on printed circuit boards.

The electrical interconnects of interconnect layer 109 that make up data buses 104 may include ground, power, and I/O signal connections to buffer chip 101 and to each of memory die stacks 103. Interconnect layer 109 can be formed on semiconductor interposer 102 using various wafer-level deposition, patterning, and etching processes, i.e., processes that are performed on a complete semiconductor wafer or other substrate. In this way, interconnect layer 109 can be formed simultaneously on a complete semiconductor substrate for a plurality of packaged memory devices, and the semiconductor substrate is subsequently singulated into individual interposer elements, such as interposer 120, with interconnect layer 109 already formed thereon. Memory device 100 may be formed using one such singulated interposer element.

Figure 4:
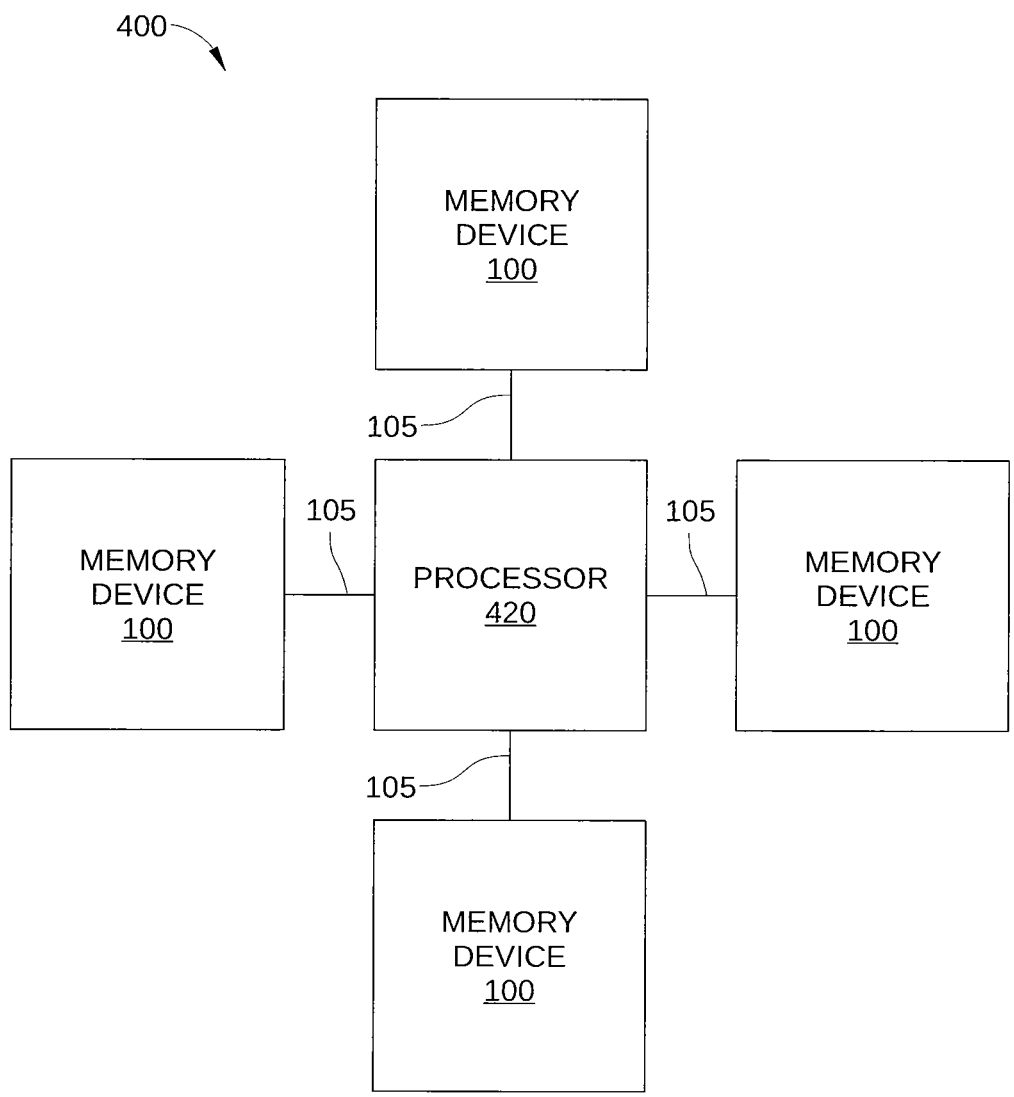
FIG. 4 illustrates a computing device in which one or more embodiments of the present invention can be implemented.

FIG. 4 illustrates a computing device in which one or more embodiments of the present invention can be implemented. Specifically, FIG. 4 is a block diagram of a computing device 400 with multiple memory devices 100 configured according to an embodiment of the present invention. As shown, computer system 400 includes four memory devices 100 and a processor 420 that is coupled to each of the memory devices 100 via a processor data bus 105. Computer system 400 may be a desktop computer, a laptop computer, a supercomputer or server system, a smartphone, a digital tablet, a personal digital assistant, a system-on-chip, or other technically feasible computing device. In some embodiments, processor 420 may be a semiconductor die singulated from a separately processed semiconductor substrate, such as a central processing unit (CPU), a graphics processing unit (GPU), an application processor or other logic device, a memory chip, a global positioning system (GPS) chip, a radio frequency (RF) transceiver chip, a Wi-Fi chip, a system-on-chip, or any other semiconductor chip.

Because each of memory devices 100 includes multiple memory die stacks that are coupled to a semiconductor interposer and are coupled to a buffer chip with wide bit-width data buses, processor 420 has access to high-capacity, high-bandwidth memory modules that are also power efficient. Furthermore, memory devices 100 have a greatly reduced form-factor relative to high-capacity memory modules, such as DIMMs, which generally required a motherboard or other printed circuit board for mounting. Thus, computing device 400 can be configured to be space-efficient and suitable for use in mobile devices and add-on cards with significant form-factor constraints.

In sum, an embodiment of the invention sets forth a memory device that includes multiple memory stacks and a buffer chip that are each coupled to a semiconductor interposer. The memory stacks, which are coupled to the buffer chip with a wide bit-width data bus, include two or more stacked memory dies. Advantageously, the memory device has both high capacity, high bandwidth, and a small form-factor. In addition, because the buffer chip communicates with the memory stacks via wide bit-width buses, the memory device operates in an energy efficient manner. Furthermore, the communication protocol by which the buffer chip communicates with the memory stacks can be matched to the communication protocol by which the buffer chip receives I/O signals from a processor, so that limited conversion logic and relatively low power is used by buffer chip 101 for converting between the two protocols.

While the foregoing is directed to embodiments of the present invention, other and further embodiments of the invention may be devised without departing from the basic scope thereof, and the scope thereof is determined by the claims that follow.

I claim:
1. A packaged memory device comprising:
a semiconductor interposer;
a first memory stack that is coupled to the semiconductor interposer and includes a first plurality of memory chips configured as a single stack;
a second memory stack that is coupled to the semiconductor interposer and includes a second plurality of memory chips configured as a single stack; and
a buffer chip that is coupled to the semiconductor interposer, coupled to the first memory stack via a first data bus, coupled to the second memory stack via a second data bus, and coupled to a processor data bus that is configured for transmitting signals between the buffer chip and a processing unit.
2. A packaged memory device comprising:
a semiconductor interposer;

a first memory stack that is coupled to the semiconductor interposer and includes a first plurality of memory chips configured as a single stack;
a second memory stack that is coupled to the semiconductor interposer and includes a second plurality of memory chips configured as a single stack; and
a buffer chip that is coupled to the semiconductor interposer, coupled to the first memory stack via a first data bus, coupled to the second memory stack via a second data bus, and coupled to a processor data bus that is configured for transmitting signals between the buffer chip and a processing unit
wherein the first data bus has a first bit width, the processor data bus has a second bit width, and the first bit width is greater than the second bit width.

3. The packaged memory device of claim 2, wherein a data transfer capacity of the processor data bus is greater than both a data transfer capacity of the first data bus and a data transfer capacity of the second data bus.

4. The packaged memory device of claim 2, wherein the data transfer capacity of the second data bus is substantially similar to the data transfer capacity of the third data bus.

5. The packaged memory device of claim 2, wherein the second data bus has a third bit width that is less than the first bit width.

6. The packaged memory device of claim 2, wherein the second bit width is substantially similar to the third bit width.

7. The packaged memory device of claim 2, wherein each of the first data bus and the second data bus is configured to carry signals compatible with a first communication protocol, the processor data bus is configured to carry signals compatible with a second communication protocol, and the buffer chip is configured to convert signals compatible with the first communication protocol to signals compatible with the second communication protocol.

8. The packaged memory device of claim 7, wherein the first communication protocol is substantially similar to the second communication protocol.

9. The packaged memory device of claim 7, wherein in the first communication protocol conforms to the graphics double data rate, version 5 (GDDR5) specification, and the second communication protocol conforms to a wide I/O communication protocol.

10. The packaged memory device of claim 2, wherein the first data bus is configured to carry signals compatible with a first communication protocol, the second data bus is configured to carry signals compatible with a second communication protocol, the processor data bus is configured to carry signals compatible with a third communication protocol and the buffer chip is configured to convert signals compatible with the first communication protocol to signals compatible with the third communication protocol and signals compatible with the second communication protocol to signals compatible with the third communication protocol.

11. The packaged memory device of claim 2, wherein a data transfer capacity of the processor data bus is substantially equal to or greater than a combined data transfer capacity of the first data bus and the second data bus.

12. The packaged memory device of claim 1, wherein the first data bus is configured for signals compatible with a first communication protocol and the third data bus is configured for carrying signals compatible with a second communication protocol that is different than the first communication protocol.

13. The packaged memory device of claim 12, wherein signals transmitted according to the first communication protocol have a lower bus frequency than a bus frequency of signals transmitted according to the second communication protocol.

14. The packaged memory device of claim 1, wherein each of the first data bus and the second data bus is formed in the semiconductor interposer.

15. The packaged memory device of claim 1, wherein the first memory stack comprises at least about 2 gigabytes of memory.

16. The packaged memory device of claim 1, wherein the first data bus has a bit width of at least about 256 bits.

17. The packaged memory device of claim 16, wherein the first data bus has a data transfer capacity of at least about 16 gigabytes per second.

18. A computing device, comprising:
a processor; and
a packaged memory device coupled to the processor, wherein the packaged memory device comprises:
a semiconductor interposer;
a first memory stack that is coupled to the semiconductor interposer and includes a first plurality of memory chips configured as a single stack;
a second memory stack that is coupled to the semiconductor interposer and includes a second plurality of memory chips configured as a single stack; and
a buffer chip that is coupled to the semiconductor interposer, coupled to the first memory stack via a first data bus, coupled to the second memory stack via a second data bus, and coupled to a processor data bus that is configured for transmitting signals between the buffer chip and a processing unit.

19. The computing device of claim 18, wherein the first data bus has a first bit width, the processor data bus has a second bit width, and the first bit width is greater than the second bit width.

20. The computing device of claim 18, each of the first data bus and the second data bus is configured to carry signals compatible with a first communication protocol, the processor data bus is configured to carry signals compatible with a second communication protocol, and the buffer chip is configured to convert signals compatible with the first communication protocol to signals compatible with the second communication protocol.

21. The computing device of claim 18, further comprising a second packaged memory device, a third packaged memory device, and a fourth packaged memory device, wherein each of the packaged memory device, the second packaged memory device, the third packaged memory device, and the fourth packaged memory device is coupled to the processor and comprises at least about 8 gigabytes of memory.

22. The packaged memory device of claim 1, wherein the first memory stack is directly coupled to the semiconductor interposer, the second memory stack is directly coupled to the semiconductor interposer; and the buffer chip is directly coupled to the semiconductor interposer.

23. The computing device of claim 18, wherein the first data bus is formed in the semiconductor interposer and the second data bus is formed in the semiconductor interposer.

* * * * *